United States Patent
Nieh et al.

(10) Patent No.: US 8,629,013 B2
(45) Date of Patent: Jan. 14, 2014

(54) JUNCTION LEAKAGE REDUCTION THROUGH IMPLANTATION

(75) Inventors: Chun-Feng Nieh, Hsinchu (TW); Chung-Yi Yu, Hsin-Chu (TW); Hung-Ta Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 13/273,463

(22) Filed: Oct. 14, 2011

(65) Prior Publication Data

US 2013/0095642 A1  Apr. 18, 2013

(51) Int. Cl.
*H01L 21/338* (2006.01)

(52) U.S. Cl.
USPC .................................. 438/174; 257/E21.403

(58) Field of Classification Search
USPC ................... 438/174, 186, 191; 257/E21.403
See application file for complete search history.

(56) References Cited

U.S. PATENT DOCUMENTS

| | | | |
|---|---|---|---|
| 7,482,211 B2 | 1/2009 | Nieh et al. | |
| 2011/0272740 A1* | 11/2011 | Umeda et al. | 257/192 |

OTHER PUBLICATIONS

Unpublished U.S. Appl. No. 13/244,340, filed Sep. 24, 2011 entitled "Forming a Protective Film on a Back Side of a Silicon Wafer in a III-V Family Fabrication Process", 27 pages.

* cited by examiner

*Primary Examiner* — Quoc Hoang
(74) *Attorney, Agent, or Firm* — Haynes and Boone, LLP

(57) ABSTRACT

Provided is a method of fabricating a semiconductor device. The method includes forming a first III-V family layer over a substrate. The first III-V family layer includes a surface having a first surface morphology. The method includes performing an ion implantation process to the first III-V family layer through the surface. The ion implantation process changes the first surface morphology into a second surface morphology. After the ion implantation process is performed, the method includes forming a second III-V family layer over the first III-V family layer. The second III-V family layer has a material composition different from that of the first III-V family layer.

18 Claims, 6 Drawing Sheets

JUNCTION LEAKAGE REDUCTION THROUGH IMPLANTATION

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The fabrication of some types of ICs may require forming a III-V family layer on a substrate. These types of IC devices may include, as examples, light-emitting diode (LED) devices, radio frequency (RF) devices, and high power semiconductor devices. However, existing methods of forming semiconductor devices using the III-V family layer may generate dislocations or defects for different bandgap materials, which may lead to device performance shortcomings such as relaxed strain, incomplete film growth, and poor junction characteristics.

Therefore, while existing methods of forming III-V family layers have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the features are formed in direct contact, and may also include embodiments in which additional features may be formed interposing the features, such that the features may not be in direct contact. Various features may be arbitrarily drawn in different scales for the sake of simplicity and clarity.

Figure 1:
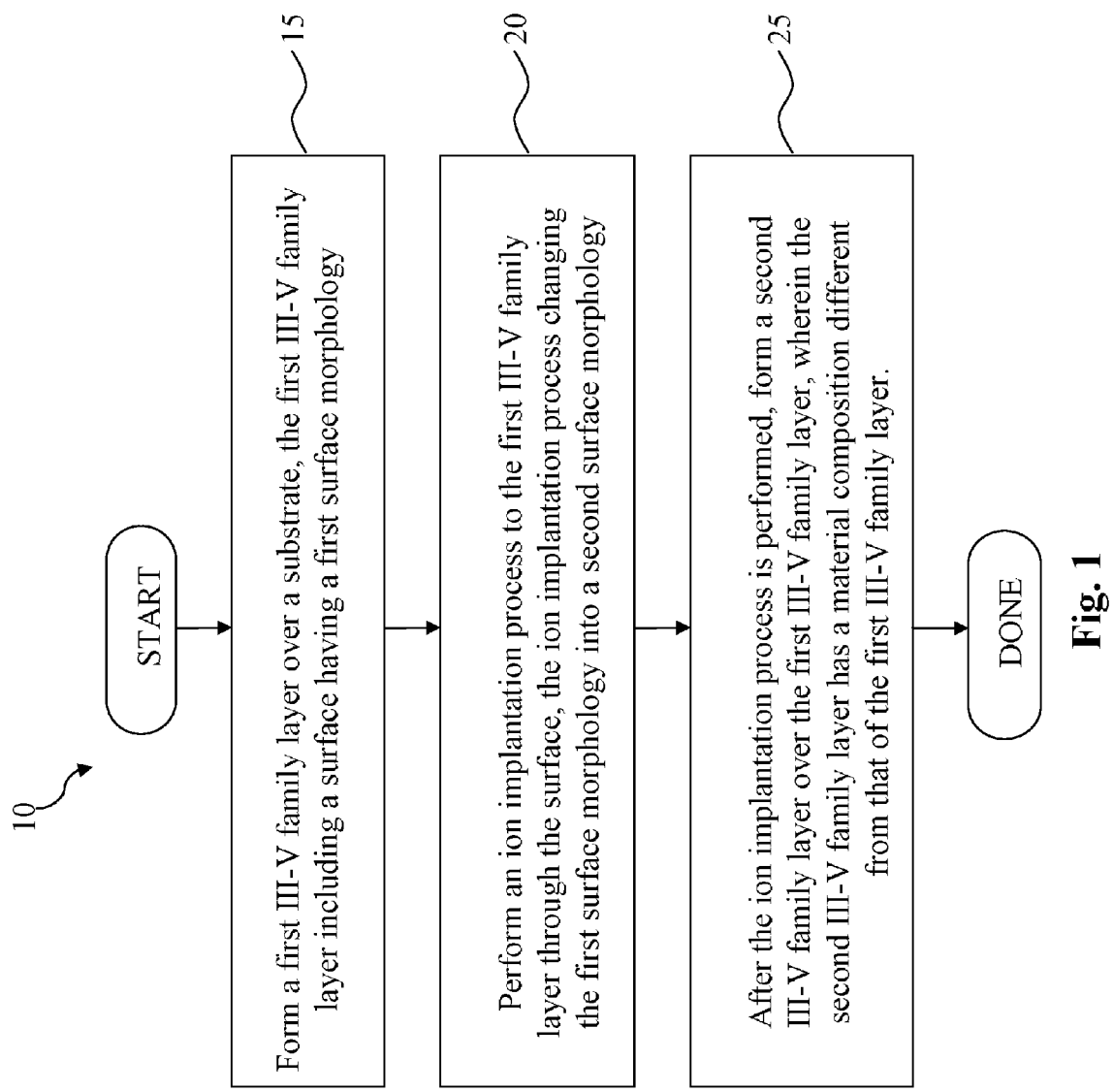
FIG. 1 is a flowchart illustrating a method for fabricating a semiconductor device according to various aspects of the present disclosure.

Illustrated in FIG. 1 is a flowchart of a method 10 for fabricating a semiconductor device according to various aspects of the present disclosure. Referring to FIG. 1, the method 10 includes block 15, in which a first III-V family layer is formed over a substrate. The first III-V family layer includes an element from a III family of a periodic table and an element from a V family of the periodic table. The first III-V family layer includes a surface having a first surface morphology. The method 10 includes block 20, in which an ion implantation process is performed to the first III-V family layer through the surface. The ion implantation process changes the first surface morphology into a second surface morphology. In an embodiment, the second surface morphology has a more flat and planarized surface than the first surface morphology. The method 10 includes block 25, in which a second III-V family layer is formed over the first III-V family layer after the ion implantation process is performed. The second III-V family layer includes an element from the III family of the periodic table and an element from the V family of the periodic table. The second III-V family layer has a material composition different from that of the first III-V family layer.

It is understood that additional processes may be performed before, during, or after the blocks 15-25 shown in FIG. 1 to complete the fabrication of the semiconductor device, but these additional processes are not discussed herein in detail for the sake of simplicity.

FIGS. 2 to 5 are diagrammatic fragmentary cross-sectional side views of a portion of a semiconductor wafer at various fabrication stages according to embodiments of the method 10 of FIG. 1. FIGS. 2 to 5 have been simplified for a better understanding of the inventive concepts of the present disclosure.

Figure 2:
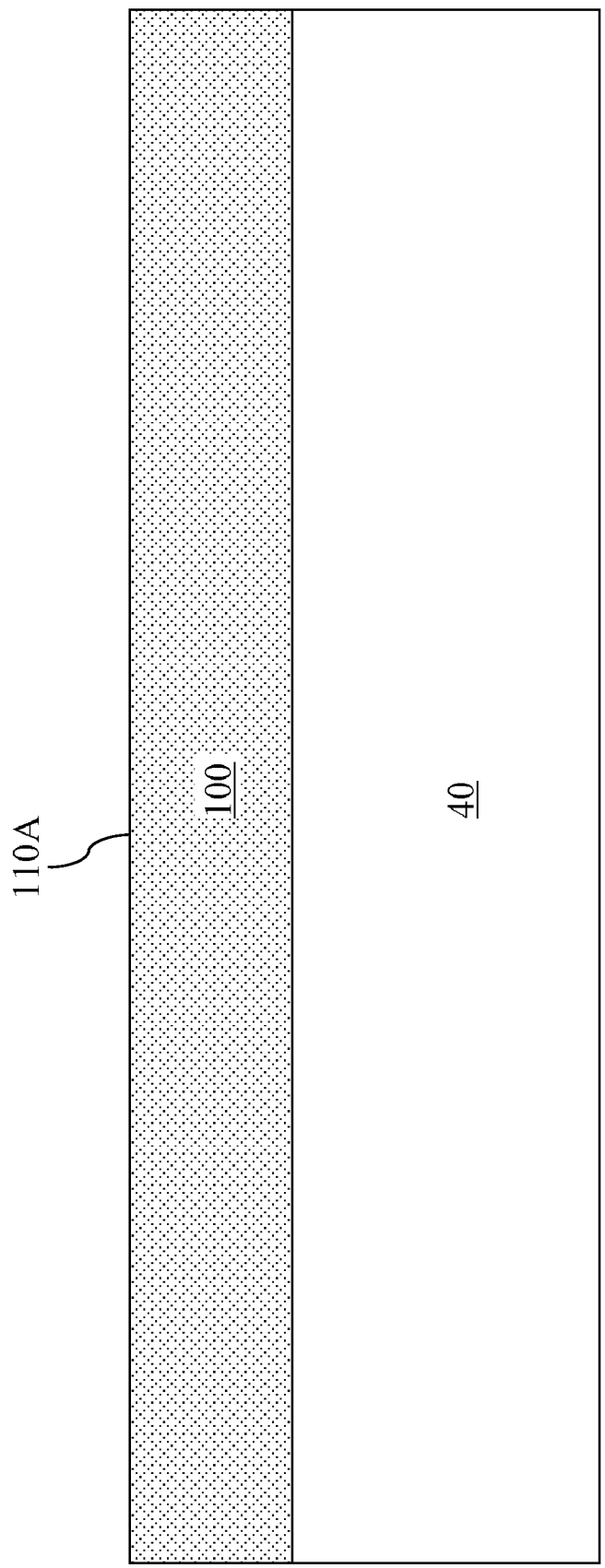
FIGS. 2-6 are diagrammatic fragmentary cross-sectional side views of a portion of a wafer at various stages of fabrication in accordance with various aspects of the present disclosure.

Referring to FIG. 2, a wafer 40 is provided. In the present embodiment, the wafer 40 includes a silicon material, and therefore may be referred to as a silicon wafer or silicon substrate 40 thereafter. It is understood however, that the wafer 40 may include other materials in alternative embodiments, for example sapphire. It is also understood that the FIGS. 2-6 illustrate only a portion of the silicon wafer 40 for the sake of simplicity, and that the wafer 40 may contain additional features that are not shown herein. For example, the silicon wafer 40 may contain a plurality of isolation structures formed therein. These isolation structures may include shallow trench isolation (STI) devices or deep trench isolation (DTI) devices, the formations of which may involve etching openings or recesses in the silicon substrate 40, filling the openings with a dielectric material, and subsequently performing a polishing process such as a chemical-mechanical-polishing (CMP) process to planarize the surface of the wafer.

A III-V family layer 100 is formed over the silicon wafer 40. The III-V family layer 100 includes an element from a "III" family (or group) of the periodic table, and another element from a "V" family (or group) of the periodic table. For example, the III family elements may include Boron, Aluminum, Gallium, Iridium, and Titanium, and the V family elements may include Nitrogen, Phosphorous, Arsenic, Antimony, and Bismuth.

In the present embodiment, the III-V family layer 100 includes an indium phosphide (InP) material. Indium phosphide materials have good electron velocity performance (for example better than that of silicon), and therefore may be suitable for high-power or high-frequency electronic applications. Indium phosphide materials also have a direct bandgap, meaning the momentum of electrons and holes is the same in both the conduction band and the valence band. As such, an electron can directly emit a photon, which makes indium phosphide materials suitable for optoelectronic devices. In other embodiments, the III-V family layer 100 may include different III-V family materials, for example gallium nitride (GaN) or gallium arsenide (GaAs).

The III-V family layer 100 may be formed by one or more epitaxial-growth processes known in the art, which may be performed at high temperatures. In some embodiments, the high temperatures range from about 800 degrees Celsius to about 1100 degrees Celsius. Although not illustrated, it is understood that a buffer layer may be formed between the silicon wafer 40 and the III-V family layer 100. Among other things, the buffer layer may reduce the stress (for example stress caused by lattice mismatch) between the silicon wafer 40 and the III-V family layer 100. It is further understood that a cladding layer (not illustrated herein) may be optionally formed over the III-V family layer 100 to enhance its electrical properties.

The III-V family layer 100 has an exposed surface 110A, which has a surface morphology that is at least partially defined by the shape and profile of the surface 110A. Although not specifically illustrated in FIG. 2, the surface 110A has a surface morphology that is not completely flat or smooth. Rather, the surface 110A may be uneven and may have a wave-like shape in a more microscopic scale. In other words, although the surface 110A may appear uniformly planarized from afar, it is actually rough and may have "rises and falls" when inspected closely. Such surface morphology may adversely affect semiconductor device performance. For example, the roughness of the surface 110A may lead to undesirable excessive junction leakage currents.

Figure 3:
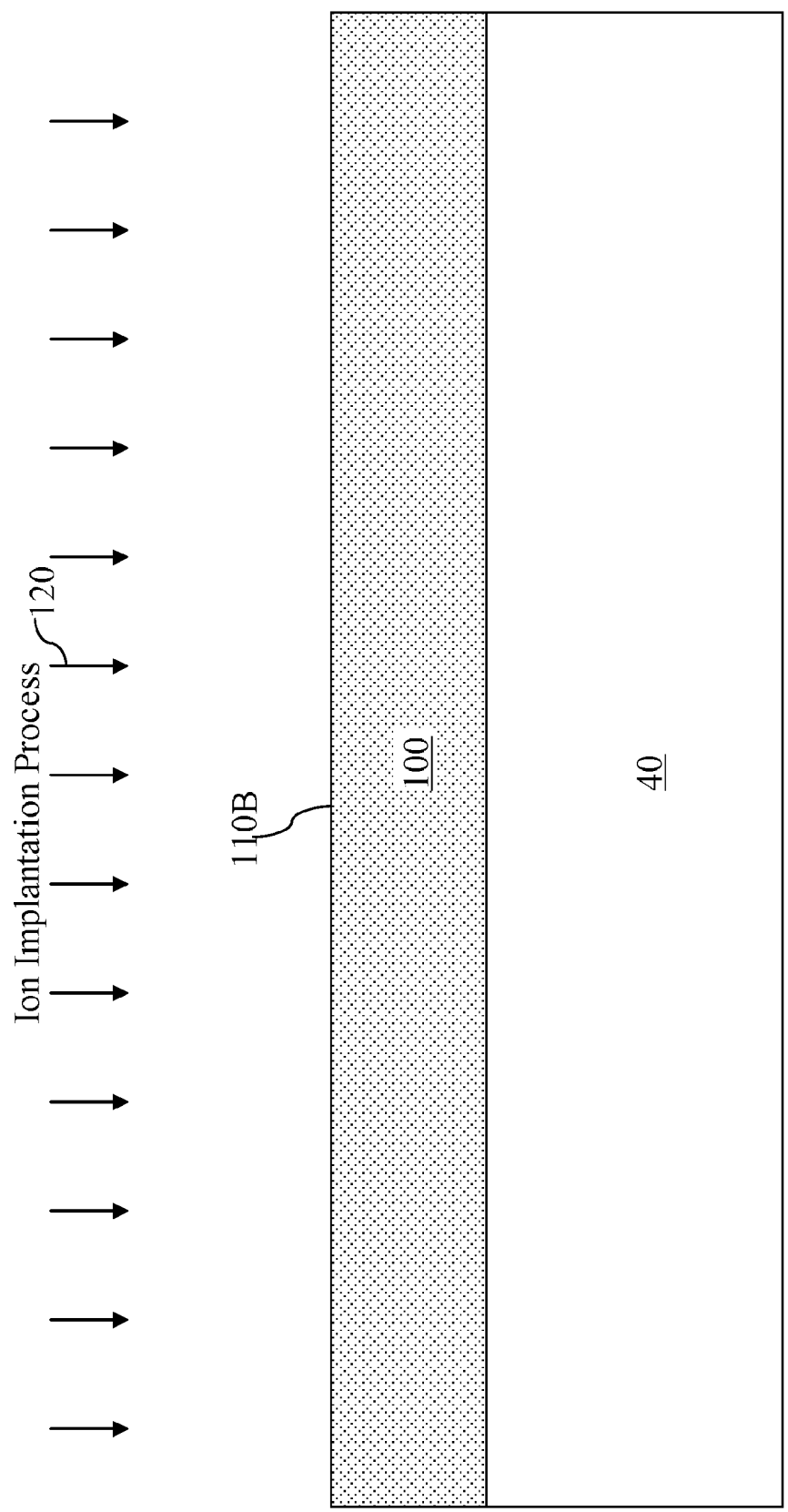

Referring now to FIG. 3, an ion implantation process 120 is performed to alleviate the leakage current issues caused by the roughness of the surface 110A. The ion implantation process 120 implants dopant ions through the surface 110A to a region of the III-V family layer below the surface 110A. These dopant ions may be implanted to a region of the III-V family layer 100 immediately below the surface 110A. In the present embodiment, the dopant ions are Argon ions. In other embodiments, the dopant ions may include Carbon, Nitrogen, and Fluorine ions.

The ion implantation process 120 help change the surface 110A to a surface 110B that has an improved morphology. Stated differently, the ion implantation process 120 alters the surface morphology of the III-V family layer 100. As discussed above, the untreated surface 110A (pre-implantation) may be rough and uneven. Consequently, future layers (for example a silicide layer) to be formed over the III-V family layer 100 may also follow the uneven contour of the surface 110A of the III-V family layer 100. The unevenness of the future layers may lead to uneven distances to source/drain regions of a semiconductor transistor device, thereby resulting in leakage current.

In the embodiments disclosed herein, dopant ions are bombarded through the untreated surface 110A during implantation. The bombardment of the untreated surface 110A may reduce the thickness or height disparity between the thicker (higher) and thinner (lower) regions of the III-V family layer 100. For example, in some cases, the bombardment of the dopant ions may knock some portions of the III-V family layer 100 from a higher region to a lower region, thereby making the surface of the III-V family layer 100 more flat or smooth. As such, the implantation process 120 helps transform the untreated surface 110A of the III-V family layer 100 into the treated surface 110B, where the treated surface 110B has an improved surface morphology. For example, the treated surface 110B is more planarized and less rough than the untreated surface 110A. The improved surface morphology of the III-V family layer 100 allows future layers formed over the III-V family layer 100 to be formed more evenly, which may reduce leakage current. Furthermore, the implantation process 120 causes dopant retardation in the III-V family layer 100, which reduces carrier diffusion and thus improves the short channel effect (SCE) performance of a semiconductor transistor device to be formed.

It is desired that the implanted dopant ions congregate mostly in a region below and near the surface 110B of the III-V family layer, and that the dopant concentration remain low. That way, the treatment will be focused mostly on the surface 110B of the III-V family layer 100 (rather than deep inside the III-V family layer 100), and no substantial damage will be caused to the III-V family layer 100 by the ion implantation process 120. Generally, the implantation depth of the implanted layer (how deep the dopant ions can penetrate) is determined by the implantation energy of the implantation process, and the concentration of dopant ions in the implanted layer is determined by the dose of the implantation process. Consequently, a lower implantation energy leads to a shallower implantation depth, and a lower implantation dose leads to a lower dopant concentration level.

Accordingly, in order to avoid causing damages to the III-V family layer 100 and to the silicon wafer 40 below, the ion implantation process 120 is performed using a light (low) implantation energy and dose. Therefore, the ion implantation process 120 may also be referred to as a light implantation process. In the present embodiment, the implantation process 120 has an implantation energy that is in a range from about 1 kilo-electron-volts (KeV) to about 20 KeV, and a dose that is in a range from about $1 \times 10^{13}$/centimeter$^2$ to about $10 \times 10^{15}$/centimeter$^2$. These implantation energy ranges and dose ranges help ensure that the dopant ions are fully utilized to reshape the morphology of the surface 110 (from 110A to 110B), and that no significant damage to the III-V family layer 100 will be caused by the dopant ions. The implantation depth may be in a range from surface to about 5 nanometers in the present embodiment.

Figure 4:
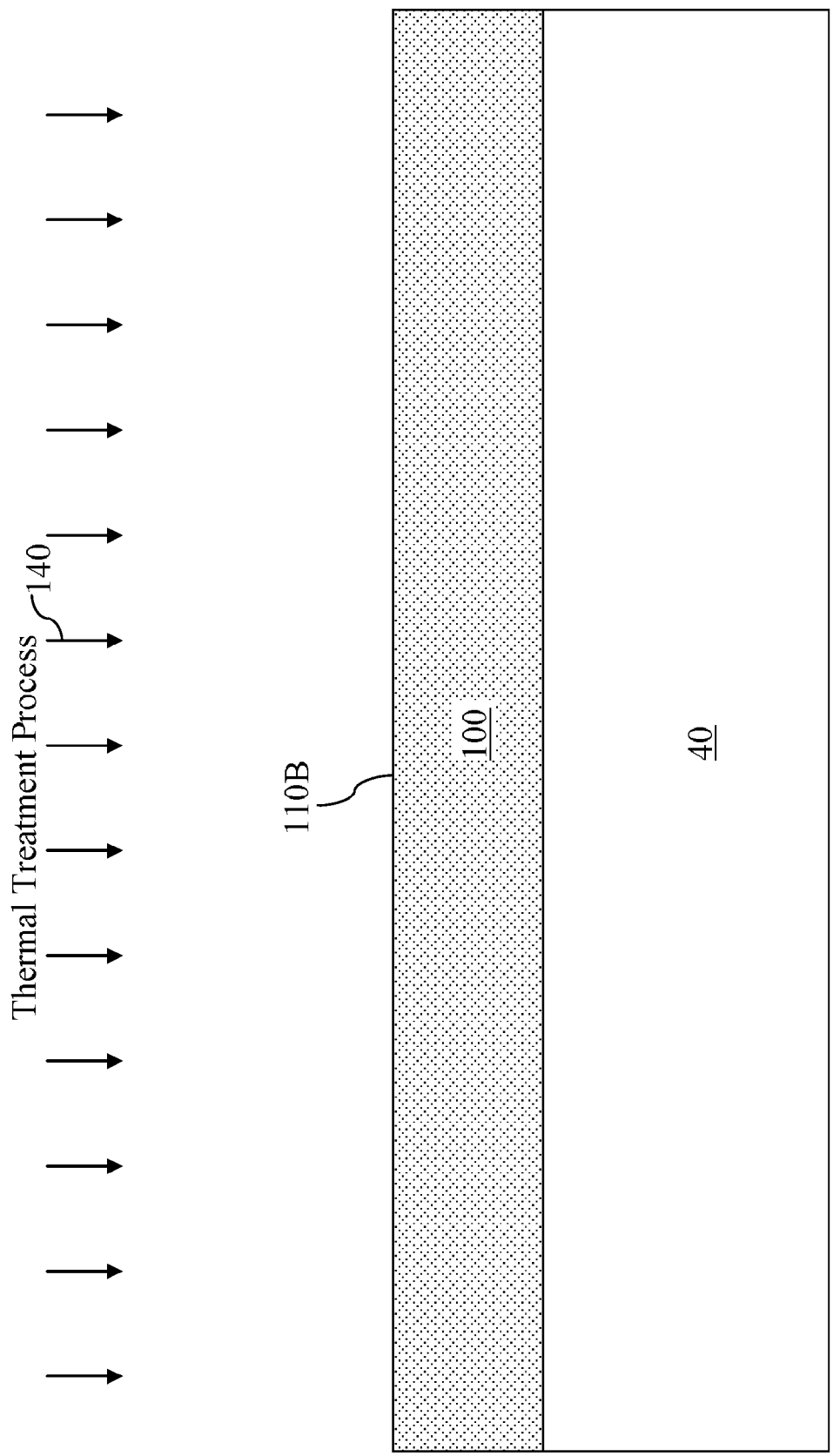

Referring now to FIG. 4, a thermal treatment process 140 is performed. The thermal treatment process 140 may be carried out in a thermal chamber or an oven, where the process temperature and process duration can be accurately controlled. In an embodiment, the thermal treatment process 140 is performed at a temperature ranging from about 400 degrees Celsius to about 1000 degrees Celsius, and for a duration ranging from about 1 second to about 60 seconds.

The thermal treatment process 140 helps repair defects in the III-V family layer 100, in particular implant induced defects near the surface region 110B of the III-V family layer 100, and meanwhile, improves surface morphology of III-V family layer 100. For example, though the implantation process 120 (FIG. 3) is tuned in a manner to minimize damages to the III-V family layer, the implantation process 120 may still cause some small amount of defects along or near the surface 110B of the III-V family layer 100. These defects may be repaired by the thermal treatment process 140 with controllable dopants diffusion behavior. Hence, the surface 110B of the III-V family layer 100 is even more smooth and planarized after the thermal treatment process 120 is performed.

Figure 5:
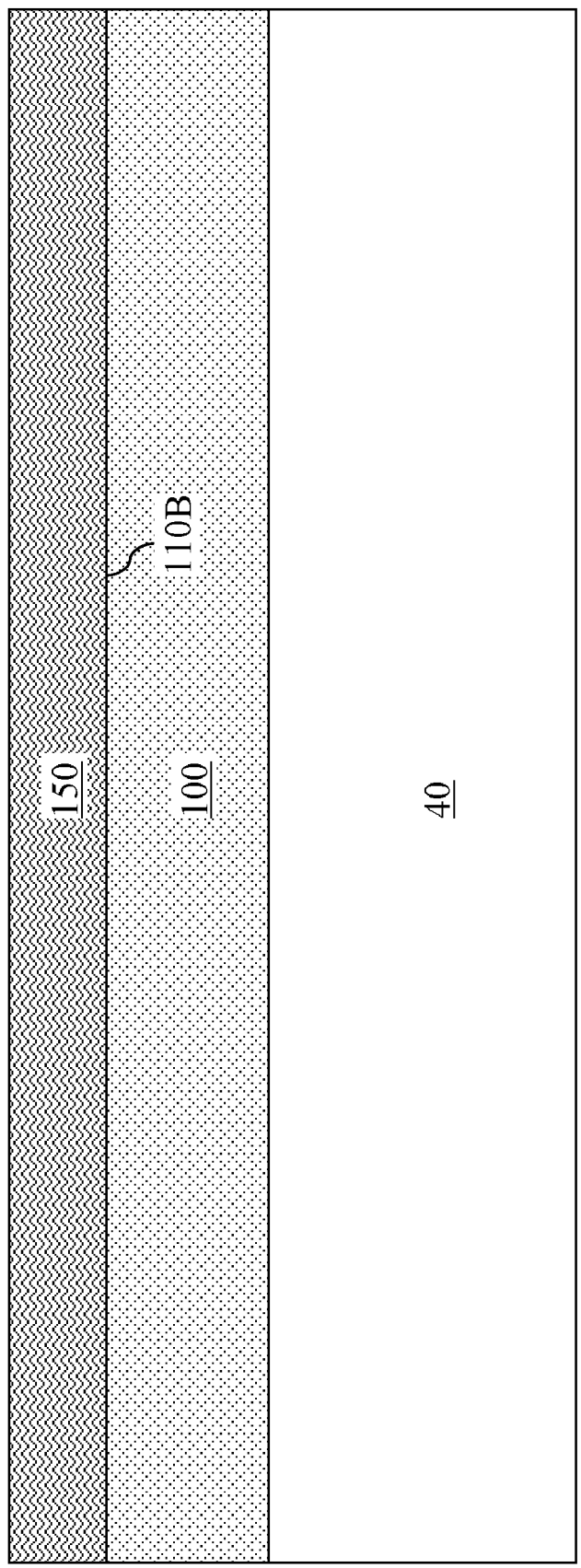

Referring now to FIG. 5, after the thermal treatment process 140 is performed, a III-V family layer 150 is formed on the III-V family layer 100. In an embodiment, the III-V family layer 150 may be formed through a suitable epitaxial growth process. In other embodiments, the III-V family layer 150 may be formed by another suitable deposition process. The III-V family layer 150 also includes at least one an element from the III family of the periodic table and at least one element from the V family of the periodic table, but it has a different material composition than that of the III-V family layer 100. In the present embodiment, the III-V family layer 150 contains indium gallium arsenide (InGaAs), whereas the III-V family layer 100 contains indium phosphide. In other embodiments, the III-V family layer 150 may include a material composed of other combinations of elements from the III family and the V family of the periodic table, such as, AlAsSb, InAs, GaAsSb, etc.

Various types of semiconductor devices can be formed using the III-V family layer 100 and the III-V family layer 150. For example, referring now to FIG. 6, a high power semiconductor device 200 may be formed. The high power semiconductor device 200 includes the silicon wafer 40 and the III-V family layers 100 and 150. The high power semiconductor device 200 includes a field effect transistor (FET) formed by a gate device 220 (or gate structure). The gate device 220 is formed over the III-V family layer 150 through a plurality of deposition and patterning processes. The gate device 220 may include a gate dielectric component and a gate electrode component.

The high power semiconductor device 200 also includes source/drain regions 240. The source/drain regions 240 are formed in the III-V family layer 150 and partially in the III-V family layer 100 through one or more ion implantation processes. These ion implantation processes are performed using substantially greater implantation energies and doses than the ion implantation process 120 (FIG. 3). For example, the implantation energies and doses of the implantation processes used to form the source/drain regions 240 may be more than ten times greater than those associated with the implantation process 120 used to treat the surface 110 of the III-V family layer 100.

The gate device 220 and the source/drain regions 240 may serve as terminals of the transistor device of the high power semiconductor device 200. When the transistor device is turned on, a conductive channel is formed below the gate device 220 and between the source/drain regions 240 in the III-V family layer 150. An electrical current will flow in the conductive channel. It is understood that the dimensions and geometric shapes of the gate device 220 and the source/drain regions 240 are merely examples, and therefore may not be in scale or accurately reflect their precise configurations in actual implementation. For example, the gate device 220 and/or the source/drain regions 240 may each be wider/narrower or thicker/thinner than illustrated in FIG. 6.

The embodiments disclosed herein offer advantages over existing methods and devices involving the formation of III-V family layers. It is understood, however, that other embodiments may offer different advantages, and that no particular advantage is required for all embodiments. As discussed above, the ion implantation process 120 (FIG. 3) and the subsequent thermal treatment process 140 (FIG. 4) help improve the surface morphology of the III-V family layer 100. For example, a more planarized and smooth surface 110B may be achieved. As a result of this better surface morphology, leakage current of the semiconductor device 200 may be reduced. In addition, another advantage is that the ion implantation process 120 leads to dopant retardation, which improves the performance of the semiconductor device 200 with respect to its short channel effect.

Figure 6:
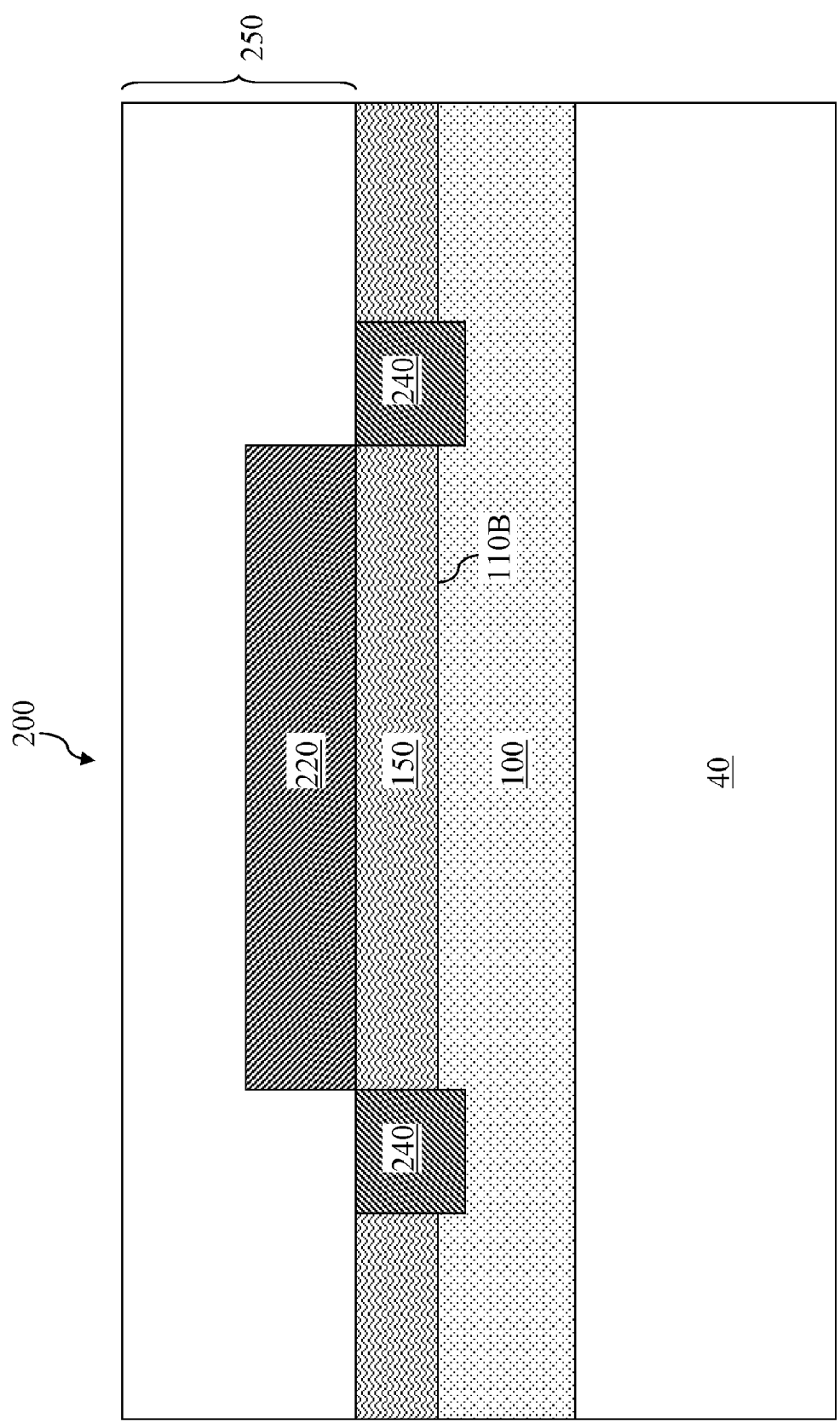

Still referring to FIG. 6, an interconnect structure 250 is also formed over the III-V family layer 150 and over the semiconductor device 200. The interconnect structure 250 includes a plurality of interconnect layers, also referred to as metal layers. Each metal layer contains a plurality of metal lines that route electrical signals. The metal layers are interconnected together by vias. Contacts are also formed over the gate device 220 and the source/drain regions 240 so that connections may be established with external devices. For the sake of simplicity, these metal lines, vias and contacts are not specifically illustrated in FIG. 6. Also, additional fabrication processes may be performed to finish the fabrication of the high power device 200, such as passivation, testing, and packaging processes. These processes are also not shown or discussed herein for reasons of simplicity.

It is understood that the high power device 200 shown in FIG. 6 and discussed above merely illustrates an example use of III-V family layers formed over a silicon wafer. In other embodiments, the methods disclosed herein may be used to form alternative devices, such as hetero-structure devices, light-emitting diode (LED) devices, radio-frequency (RF) devices, and high electron mobility transistor (HEMT) devices. In fact, as long as it is desirable to form a III-V family layer on a silicon substrate, the method and structure disclosed by the present disclosure may be applied to achieve the various advantages discussed above.

One of the broader forms of the present disclosure involves a method of fabricating a semiconductor device. The method includes: forming a first III-V family layer over a substrate, the first III-V family layer including a surface having a first surface morphology; performing an ion implantation process to the first III-V family layer through the surface, the ion implantation process changing the first surface morphology into a second surface morphology; and after the ion implantation process is performed, forming a second III-V family layer over the first III-V family layer, wherein the second III-V family layer has a material composition different from that of the first III-V family layer.

In an embodiment, the second surface morphology is smoother and more planarized than the first surface morphology.

In an embodiment, the method further includes: after the performing the ion implantation process and before the forming the second III-V family layer, performing a thermal process to the first III-V family layer.

In an embodiment, the method further includes: after the forming the second III-V family layer, forming a transistor device in a manner such that the transistor device is at least partially formed in the second III-V family layer.

In an embodiment, the forming the transistor device is carried out in a manner such that the transistor device includes a conductive channel that is formed in the second III-V family layer.

In an embodiment, the ion implantation process is performed in a manner such that a plurality of dopant ions are implanted to the first III-V family layer, and wherein the dopant ions include a material selected from the group consisting of: Argon, Carbon, Nitrogen, and Fluorine.

In an embodiment, the ion implantation process is performed in a manner such that the plurality of dopant ions is implanted immediately below the surface of the first III-V family layer.

In an embodiment, the implantation process has an implantation energy that is in a range from about 1 KeV to about 20 KeV; and the implantation process has a dose that is in a range from about $1\times10^{13}$/centimeter$^2$ to about $10\times10^{15}$/centimeter$^2$.

In an embodiment, the first III-V family layer and the second III-V family layer each include a respective element in a III family of a periodic table and a respective element in a V family of the periodic table.

In an embodiment, the substrate is a silicon substrate; the first III-V family layer includes indium phosphide; and the second III-V family layer includes indium gallium arsenide.

Yet another of the broader forms of the present disclosure involves a method of fabricating a semiconductor device. The method includes: forming a first III-V family layer over a wafer; treating the first III-V family layer with a light implantation process, the light implantation process improving a surface morphology of the first III-V family layer; thereafter treating the first III-V family layer with a thermal process; and thereafter forming a second III-V family layer over the first III-V family layer, the first and second III-V family layers having different material compositions.

In an embodiment, the treating the first III-V family layer with a light implantation process planarizes a surface of the first III-V family layer.

In an embodiment, the light implantation process is carried out using: an implantation energy that is in a range from about 1 KeV to about 20 KeV; a dose that is in a range from about $1\times10^{13}$/centimeter$^2$ to about $10\times10^{15}$/centimeter$^2$; and a dopant that includes one of Argon, Carbon, Nitrogen, and Fluorine.

In an embodiment, the wafer includes silicon; the first III-V family layer includes indium phosphide; and the second III-V family layer includes indium gallium arsenide.

In an embodiment, the method further includes: after the second III-V family layer is formed, forming a transistor device at least partially in the second III-V family layer.

In an embodiment, the forming the transistor device includes performing one or more ion implantation processes having an implantation energy substantially greater than that of the light implantation process.

Still another of the broader forms of the present disclosure involves a method of fabricating a semiconductor device. The method includes: forming a first semiconductor layer over a silicon substrate, the first semiconductor layer including at least one element from a III group of a periodic table and at least one element from a V group of the periodic table; implanting a plurality of dopant ions to the first semiconductor layer, the dopant ions including at least one element selected from the group consisting of: Argon, Carbon, Nitrogen, and Fluorine; performing a thermal treating process to the first semiconductor layer after the implanting, wherein the implanting and the performing the thermal treating process are carried out in a manner to alter a surface morphology of the first semiconductor layer; forming a second semiconductor layer over the first semiconductor layer, the second semiconductor layer including at least one element from the III group of the periodic table and at least one element from the V group of the periodic table, wherein the first and second semiconductor layers include different material compositions; and forming a transistor device at least partially in the second semiconductor layer.

In an embodiment, the surface morphology is flattened and planarized through the implanting and the performing the thermal treating process.

In an embodiment, the implanting the plurality of dopant ions is carried out using an implantation energy that is in a range from about 1 KeV to about 20 KeV and a dose that is in a range from about $1\times10^{13}$/centimeter$^2$ to about $10\times10^{15}$/centimeter$^2$.

In an embodiment, the first semiconductor layer includes indium phosphide; and the second semiconductor layer includes indium gallium arsenide.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a first III-V family layer over a substrate, the first III-V family layer including a surface having a first surface morphology;
    performing an ion implantation process to the first III-V family layer through the surface, the ion implantation process changing the first surface morphology into a second surface morphology;
    performing a thermal process to the first III-V family layer; and
    after the ion implantation process is performed, forming a second III-V family layer over the first III-V family layer, wherein the second III-V family layer has a material composition different from that of the first III-V family layer, and wherein the first III-V family layer and the second III-V family layer each include a respective element in a III family of a periodic table and a respective element in a V family of the periodic table.

2. The method of claim 1, wherein the second surface morphology is smoother and more planarized than the first surface morphology.

3. The method of claim 1, further including: after the forming the second III-V family layer, forming a transistor device in a manner such that the transistor device is at least partially formed in the second III-V family layer.

4. The method of claim 3, wherein the forming the transistor device is carried out in a manner such that the transistor device includes a conductive channel that is formed in the second III-V family layer.

5. The method of claim 1, wherein the ion implantation process is performed in a manner such that a plurality of dopant ions are implanted to the first III-V family layer, and wherein the dopant ions include a material selected from the group consisting of: Argon, Carbon, Nitrogen, and Fluorine.

6. The method of claim 5, wherein the ion implantation process is performed in a manner such that the plurality of dopant ions are implanted immediately below the surface of the first III-V family layer.

7. The method of claim 1, wherein:
    the implantation process has an implantation energy that is in a range from about 1 KeV to about 20 KeV; and
    the implantation process has a dose that is in a range from about $1\times10^{13}$/centimeter$^2$ to about $10\times10^{15}$/centimeter2.

8. The method of claim 1, wherein:
    the substrate is a silicon substrate;
    the first III-V family layer includes indium phosphide; and
    the second III-V family layer includes indium gallium arsenide.

9. A method of fabricating a semiconductor device, comprising:
    forming a first III-V family layer over a wafer;
    treating the first III-V family layer with a light implantation process, the light implantation process improving a surface morphology of the first III-V family layer;
    thereafter treating the first III-V family layer with a thermal process; and thereafter forming a second III-V family layer over the first III-V family layer, the first and second III-V family layers having different material compositions;

wherein the first III-V family layer and the second III-V family layer each include a respective element in a III group of a periodic table and a respective element in a V group of the periodic table.

10. The method of claim 9, wherein the treating the first III-V family layer with a light implantation process planarizes a surface of the first III-V family layer.

11. The method of claim 9, wherein the light implantation process is carried out using:

an implantation energy that is in a range from about 1 KeV to about 20 KeV;

a dose that is in a range from about $1\times10^{14}$/centimeter$^2$ to about $10\times10^{15}$/centimeter$^2$; and a dopant that includes one of Argon, Carbon, Nitrogen, and Fluorine.

12. The method of claim 9, wherein:

the wafer includes silicon;

the first III-V family layer includes indium phosphide; and the second III-V family layer includes indium gallium arsenide.

13. The method of claim 9, further including: after the second III-V family layer is formed, forming a transistor device at least partially in the second III-V family layer.

14. The method of claim 13, wherein the forming the transistor device includes performing one or more ion implantation processes having an implantation energy substantially greater than that of the light implantation process.

15. A method of fabricating a semiconductor device, comprising:

forming a first semiconductor layer over a silicon substrate, the first semiconductor layer including at least one element from a III group of a periodic table and at least one element from a V group of the periodic table;

implanting a plurality of dopant ions to the first semiconductor layer, the dopant ions including at least one element selected from the group consisting of: Argon, Carbon, Nitrogen, and Fluorine;

performing a thermal treating process to the first semiconductor layer after the implanting, wherein the implanting and the performing the thermal treating process are carried out in a manner to alter a surface morphology of the first semiconductor layer;

forming a second semiconductor layer over the first semiconductor layer, the second semiconductor layer including at least one element from the III group of the periodic table and at least one element from the V group of the periodic table, wherein the first and second semiconductor layers include different material compositions; and forming a transistor device at least partially in the second semiconductor layer.

16. The method of claim 15, wherein the surface morphology is flattened and planarized through the implanting and the performing the thermal treating process.

17. The method of claim 15, wherein the implanting the plurality of dopant ions is carried out using an implantation energy that is in a range from about 1 KeV to about 20KeV and a dose that is in a range from about $1\times10^{13}$/centimeter$^2$ to about $10\times10^{15}$/centimeter$^2$.

18. The method of claim 15, wherein:

the first semiconductor layer includes indium phosphide; and the second semiconductor layer includes indium gallium arsenide.

* * * * *